US010432167B2

(12) United States Patent
Elsherbini et al.

(10) Patent No.: US 10,432,167 B2
(45) Date of Patent: Oct. 1, 2019

(54) PIEZOELECTRIC PACKAGE-INTEGRATED CRYSTAL DEVICES

(71) Applicant: Intel Corporation, Santa Clara, CA (US)

(72) Inventors: Adel A. Elsherbini, Chandler, AZ (US); Feras Eid, Chandler, AZ (US); Baris Bicen, Chandler, AZ (US); Telesphor Kamgaing, Chandler, AZ (US); Vijay K. Nair, Mesa, AZ (US); Johanna M. Swan, Scottsdale, AZ (US); Georgios C. Dogiamis, Gilbert, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 671 days.

(21) Appl. No.: 15/088,814

(22) Filed: Apr. 1, 2016

(65) Prior Publication Data

US 2017/0288635 A1    Oct. 5, 2017

(51) Int. Cl.
*H03H 9/17* (2006.01)
*H03H 9/02* (2006.01)
(Continued)

(52) U.S. Cl.
CPC .......... *H03H 9/02259* (2013.01); *H03H 9/17* (2013.01); *H03H 9/2463* (2013.01);
(Continued)

(58) Field of Classification Search
CPC ... H03H 2009/155; H03H 2009/02291; H03H 9/2462; H03H 9/17; H03H 9/02259
See application file for complete search history.

(56) References Cited

U.S. PATENT DOCUMENTS 4,805,456 A * 2/1989 Howe ................... G01P 15/097
73/514.18
4,973,875 A * 11/1990 Yatsuda ............. H03H 9/02787
310/313 B (Continued)

FOREIGN PATENT DOCUMENTS

EP        1764597 A1 *  3/2007  ........... G01L 9/0025
JP     2014165758 A      9/2014
WO   WO 2015122840      8/2015

OTHER PUBLICATIONS

International Preliminary Report on Patentablity for International Patent Application No. PCT/US2017/017239, dated Oct. 11, 2018, 8 pages.

(Continued)

*Primary Examiner* — J. San Martin
(74) *Attorney, Agent, or Firm* — Schwabe, Williamson & Wyatt, P.C.

(57) ABSTRACT

Embodiments of the invention include a piezoelectric resonator which includes an input transducer having a first piezoelectric material, a vibrating structure coupled to the input transducer, and an output transducer coupled to the vibrating structure. In one example, the vibrating structure is positioned above a cavity of an organic substrate. The output transducer includes a second piezoelectric material. In operation the input transducer causes an input electrical signal to be converted into mechanical vibrations which propagate across the vibrating structure to the output transducer.

20 Claims, 6 Drawing Sheets

(51) Int. Cl.
*H03H 9/24* (2006.01)
*H03H 9/15* (2006.01)

(52) U.S. Cl.
CPC ............. *H03H 2009/02291* (2013.01); *H03H 2009/155* (2013.01)

(56) References Cited

U.S. PATENT DOCUMENTS

| | | | | |
|---|---|---|---|---|
| 5,129,262 | A * | 7/1992 | White | G01H 13/00 310/313 R |
| 5,212,988 | A * | 5/1993 | White | B01L 3/5027 73/599 |
| 5,281,935 | A * | 1/1994 | Knecht | H03H 9/56 310/348 |
| 7,343,805 | B2 * | 3/2008 | Combi | G01L 9/0025 73/570 |
| 10,270,414 | B2 * | 4/2019 | Kuroyanagi | H03H 3/08 |
| 2001/0028285 | A1 * | 10/2001 | Klee | H03H 3/04 333/188 |
| 2001/0048352 | A1 * | 12/2001 | Klee | H03H 3/04 333/188 |
| 2006/0176126 | A1 * | 8/2006 | Wang | H03H 3/02 333/187 |
| 2007/0139140 | A1 * | 6/2007 | Rao | H03H 3/0076 333/188 |
| 2010/0327994 | A1 | 12/2010 | Choy et al. | |
| 2013/0271238 | A1 | 10/2013 | Onda et al. | |
| 2014/0070671 | A1 | 3/2014 | Park et al. | |

OTHER PUBLICATIONS

International Search Report and Written Opinion for PCT/US2017/017239 dated May 17, 2017, 11 pages.

* cited by examiner

PIEZOELECTRIC PACKAGE-INTEGRATED CRYSTAL DEVICES

FIELD OF THE INVENTION

Embodiments of the present invention relate generally to package integrated devices. In particular, embodiments of the present invention relate to piezoelectric package integrated crystal devices.

BACKGROUND OF THE INVENTION

Frequency stable oscillators are used in many microprocessors and digital applications. For example, oscillators are used in conjunction with a phase locked loop (PLL) to provide the clock frequency for central processing units (CPUs). Oscillators are also used in wireless application with PLLs to provide accurate carrier frequencies to meet the wireless standards for different protocols such as Bluetooth, GSM, and LTE. Typically, the oscillator frequency is controlled using a tank circuit (e.g., an inductor and capacitor in parallel or in series). One drawback of tank circuits is that standard inductors and capacitors have relatively low quality factors resulting in poor frequency stability over time and over temperature. Thus, a piezo crystal element is typically used. In its simplest form, a piezo crystal consists of a piezoelectric material between two plates and it oscillates at a precisely controlled frequency. Electrically, crystals are equivalent to tank circuits with very high quality factors. The crystals are typically sold as surface mount (SMT) components.

Recent miniaturization trends in wearables and the Internet of Things (IoT) require smaller and cheaper components. Piezo crystal components are relatively large and expensive (e.g., approximately $0.5-$1/piece). The piezo crystal components also typically have large Z-height (e.g., greater than or equal to 0.6 mm) which impacts the overall system cost and Z-height of a microelectronic device. The other oscillator solution that is currently available is based on Si-MEMS based resonators that can be made smaller in XY dimensions and have higher quality factors than passive networks; however their fabrication may be cost-prohibitive and they would still require assembly as discrete components to the system or board.

DETAILED DESCRIPTION OF THE INVENTION

Figure 1:
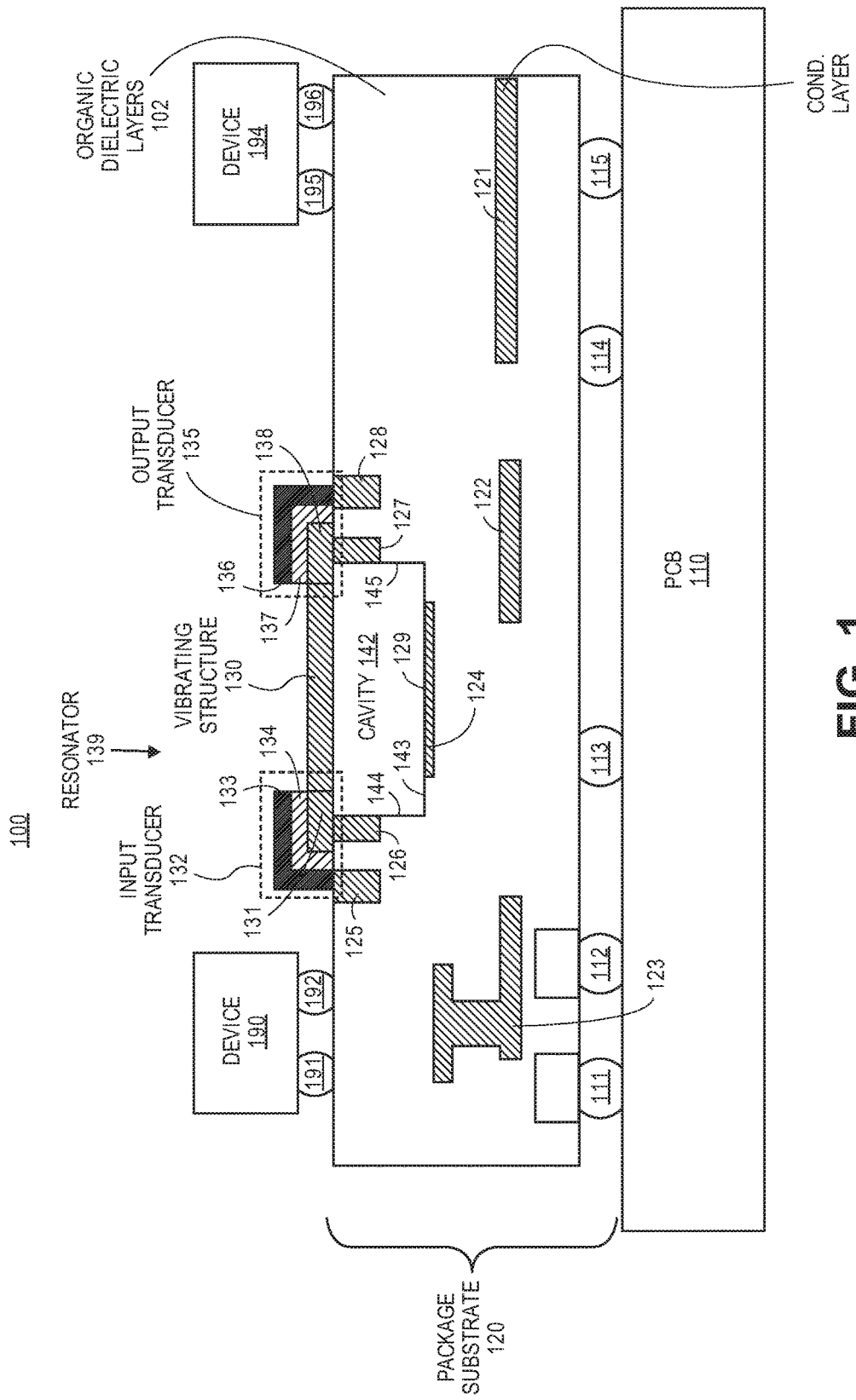
FIG. 1 illustrates a view of a microelectronic device 100 having a package-integrated piezoelectric resonator device, according to an embodiment.

Described herein are piezoelectric package integrated MEMS crystal devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Silicon micro-electromechanical (MEMS) resonators can be made smaller and have higher quality factors than passive filter networks, however their fabrication may be expensive due to the wafer-level nature of Si-MEMS processing. In addition, Si-MEMS resonators require assembly of components to the system or board. The present design includes an architecture that allows in-situ fabrication of MEMS crystal devices in a compact form factor on package substrates using organic panel-level (e.g., approximately 0.5 m×0.5 m sized panels) high volume manufacturing technology, without requiring the assembly of external bulky components or expensive Si MEMS fabrication.

The present design addresses the fabrication of MEMS crystal resonator devices within the semiconductor package substrate that is compatible with high volume package substrate fabrication technology. This present design for MEMS crystal resonator devices integrated in a package substrate is based on our ability to deposit piezoelectric materials in the package substrate and create vibrating structures in the substrate.

In one embodiment, this technology allows the fabrication of micro-electromechanical piezoelectric crystal resonator devices utilizing substrate manufacturing technology. These MEMS crystal devices include suspended vibrating structures. The structures contain stacks of piezoelectric material and electrodes that can be used to apply a voltage to the piezoelectric layer.

In operation, an input transducer receives an electrical signal which is converted into mechanical vibrations because of the piezoelectric element in the transducer. These mechanical vibrations are converted back to an electrical signal at the output transducer. When the signal's frequency matches the mechanical resonant frequency of the suspended structure, high amplitude vibrations are generated resulting in higher amplitude electrical signals at the output transducer.

The present design results in package-integrated crystal resonator devices, thus enabling smaller and thinner systems in comparison to discrete crystal resonator devices attached to a substrate. The package-integrated crystal resonator devices do not add a Z height (along the vertical axis) to a total height of a substrate or multiple substrates. This present design can be manufactured as part of the substrate fabrication process with no need for purchasing and assembling discrete components. It therefore enables high volume manufacturability (and thus lower costs) of systems that need filter devices (e.g., RF filters, etc).

In one example, the present design includes package-integrated structures to act as crystal resonator devices. Those structures are manufactured as part of the package layers and are made free to vibrate or move by removing the dielectric material around them. The structures consist of piezoelectric stacks that are deposited and patterned layer-by-layer into the package. The present design includes creating functional crystal resonators in the package on the principle of suspended and vibrating structures. Etching of the dielectric material in the package occurs to create cavities. Piezoelectric material deposition (e.g., 0.5 to 1 um deposition thickness) and crystallization also occurs in the package substrate during the package fabrication process. An annealing operation at a lower substrate temperature range (e.g., up to 260 C) allows crystallization of the piezoelectric material (e.g., lead zirconate titanate (PZT), sodium potassium niobate, AlN, ZnO, etc) to occur during the package fabrication process. In one example, laser pulsed annealing occurs locally with respect to the piezoelectric material for the annealing operation without damaging other layers of the package substrate (e.g., organic substrate) including organic layers.

The present design provides advantages compared to assembling the resonators as SMT components. For example, the present design provides a lower cost (e.g., component-wise and removal of assembly cost), much smaller form factor and zero Z-height addition since the crystal is now completely contained within the package substrate, and reduced routing parasitics which can allow higher frequency resonators (e.g., 0.5-5 GHz if needed).

Referring now to FIG. 1, a view of a microelectronic device 100 having package-integrated piezoelectric resonator devices is shown, according to an embodiment. In one example, the microelectronic device 100 includes multiple devices 190 and 194 (e.g., die, chip, CPU, silicon die or chip, etc.) that are coupled or attached to a package substrate 120 (or printed circuit board 110) with solder balls 191-192, 195-196). The package substrate 120 is coupled or attached to the printed circuit board (PCB) 110 using, for example, solder balls 111 through 115.

The package substrate 120 (e.g., organic substrate) includes organic dielectric layers 102 and conductive layers 121-128. Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 120 can be formed during package substrate processing (e.g., panel level). The panels formed can be large (e.g., having in-plane dimensions of approximately 0.5 meter by 0.5 meter, or greater than 0.5 meter, etc.) for lower cost. A cavity 142 is formed within the packaging substrate 120 by removing one or more layers (e.g., organic layers, dielectric layers, etc.) from the packaging substrate 120. The cavity 142 includes a lower member 143 and sidewalls 144-145. In one example, a resonator 139 includes a piezoelectric vibrating structure 130 (e.g., conductive structure, suspend beam), an input transducer 132, and an output transducer 135. The input transducer includes a conductive electrode 133, a piezoelectric material 134, and a region 131 of the vibrating structure 130 that acts as an electrode (or another electrode can be patterned to act as an electrode of the input transducer). The output transducer includes a conductive electrode 136, a piezoelectric material 137, and a region 138 of the vibrating structure that acts as an electrode (or another electrode can be patterned to act as an electrode of the output transducer). The three structures 133, 134, and 131 form a first piezoelectric stack and the structures 136, 137, and 138 form a second piezoelectric stack. The cavity 142 can be air filled or vacuum filled.

Figure 2:
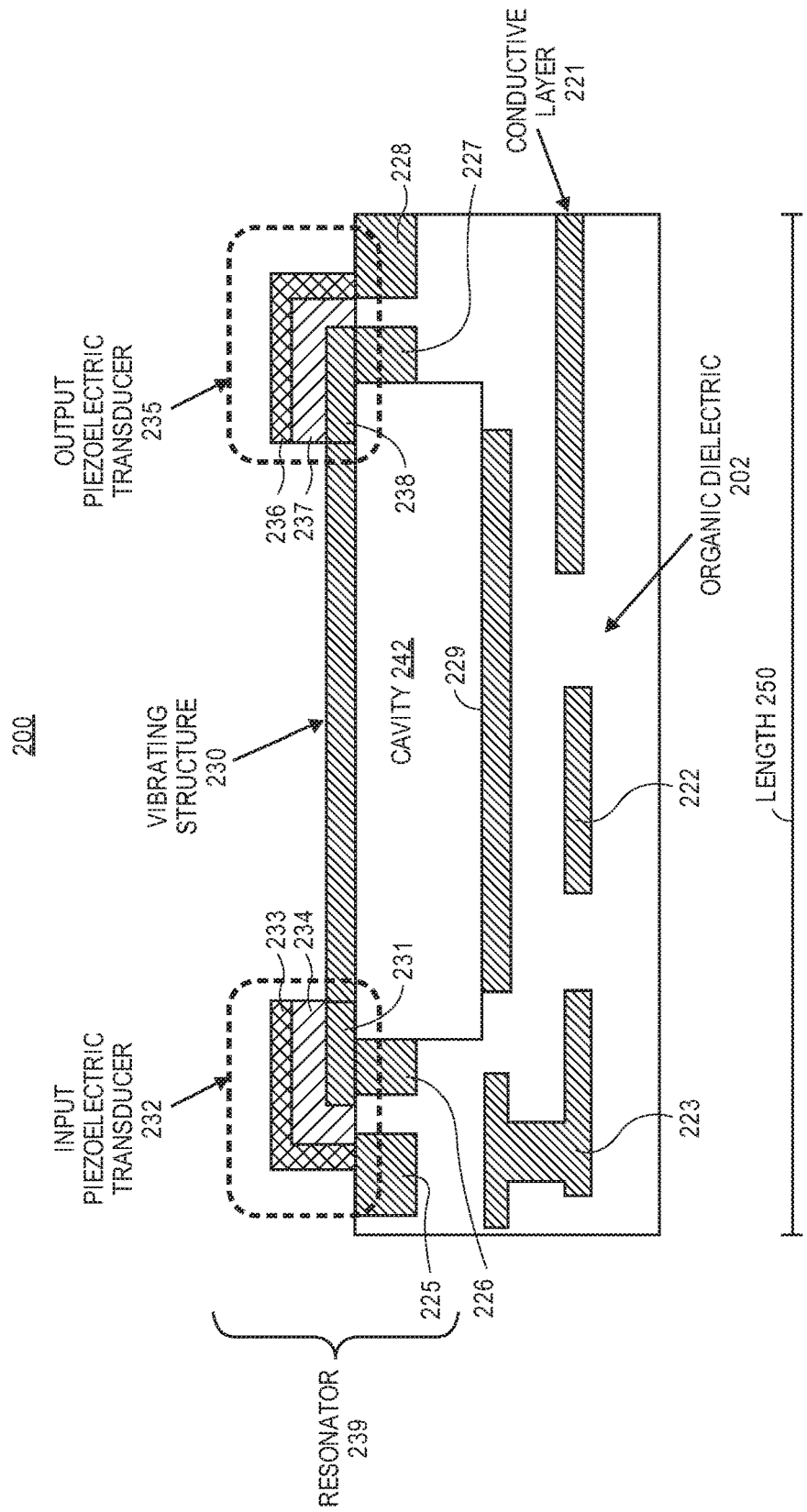
FIG. 2 illustrates a package substrate having a package-integrated piezoelectric resonator device, according to an embodiment.

FIG. 2 illustrates a package substrate having a package-integrated piezoelectric resonator device, according to an embodiment. In one example, the package substrate 200 may be coupled or attached to multiple devices (e.g., die, chip, CPU, silicon die or chip, etc.) and also coupled or attached to a printed circuit board (e.g., PCB 110 in FIG. 1). The package substrate 200 (e.g., organic substrate) includes organic dielectric layers 202 and conductive layers 221-229. The package substrate 200 can be formed during package substrate processing (e.g., panel level). A cavity 242 is formed within the packaging substrate 200 by removing one or more layers (e.g., organic layers, dielectric layers, etc.) from the packaging substrate 200. In one example, a piezoelectric resonator device 239 (e.g., resonator) is formed with conductive vibrating structure 230, input transducer 232, and output transducer 235. The input transducer includes a conductive electrode 233, a piezoelectric material 234, and a region 231 of the vibrating structure 230 that acts as an electrode (or another electrode can be patterned to act as an electrode of the input transducer). The output transducer includes a conductive electrode 236, a piezoelectric material 237, and a region 238 of the vibrating structure that acts as an electrode (or another electrode can be patterned to act as an electrode of the output transducer). The three structures 233, 234, and 231 form a first piezoelectric stack and the structures 236, 237, and 238 form a second piezoelectric stack. In one example, the piezoelectric material 234 is disposed (e.g., deposited) on the region 231 of the vibrating structure and the conductive electrode 233 is disposed (e.g., deposited) on the material 234. The piezoelectric material 237 is disposed (e.g., deposited) on the region 238 of the vibrating structure and the conductive electrode 236 is disposed on the material 237. The cavity 242 can be air filled or vacuum filled. The vibrating structure 230 is anchored on edges of the cavity by package connections 226 and 227 (e.g., anchors, vias) which may serve as both mechanical anchors as well as electrical connections to the rest of the package.

In operation, an input electrical signal at one of the terminals (e.g., input transducer 232) is converted into mechanical vibrations because of the piezoelectric transducer element 234. There are many different vibration modes that can be used depending on the application and the required resonance frequency, quality factor, and resonator size. The simplest resonator is a suspended mechanical beam as illustrated in FIG. 2 but more complex resonators such as contour mode resonators are also possible. These mechanical vibrations propagate across the vibrating structure to the other terminal (e.g., output transducer 235) where the mechanical vibration are converted back to electrical signals by the other piezoelectric transducer element 237 at that terminal.

In one example, the package substrate 200 includes a resonator 239 have a length 250 (e.g., at least 50 microns, 50-150 microns, etc.) and a vibrating structure 230 having a suspended beam width of 10-500 microns.

Figure 3:
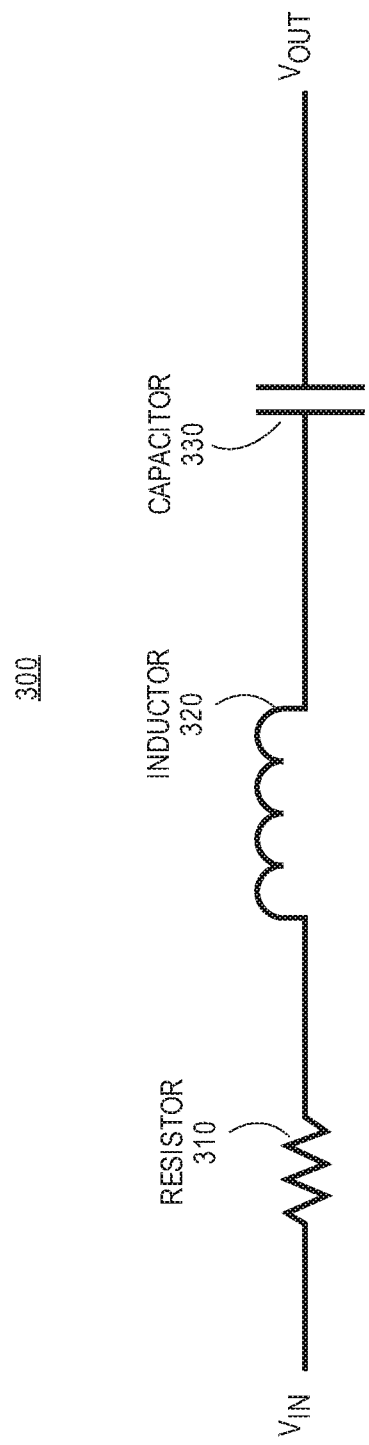
FIG. 3 illustrates a simplified equivalent circuit of a resonator in accordance with one embodiment.

Referring to FIG. 3, at frequencies different than the resonance frequency of the structure, the electrical signal generated at the output terminal Vout is very small in comparison to the electrical signal generated at the input terminal Vin. At the resonance frequency, vibrations with much larger amplitude are generated in the resonator resulting in higher electrical output signals at the output transducer element. This can be represented using the simplified equivalent circuit shown in FIG. 3 in accordance with one embodiment. The equivalent circuit includes a resistor 310, inductor 320, and capacitor 330 which are coupled in series.

In one example, a typical size for a commercial 12 MHz resonator is 3.2×2.5 mm and has a Z-height of 0.6 mm. One of the reasons for the larger size is the required packaging for the crystal resonator element and the required connections between the crystal resonator and the board. With the present design architecture, the resonator element size can be as small as 100 um if needed (e.g., assuming copper as the resonator material, a simple suspended beam resonator, and speed of sound of approximately 2300 m/s). Higher order modes or different resonator structures can be used. Both can enable larger resonator size to allow good frequency accuracy with manufacturing tolerances or enable higher quality factors.

Figure 4:
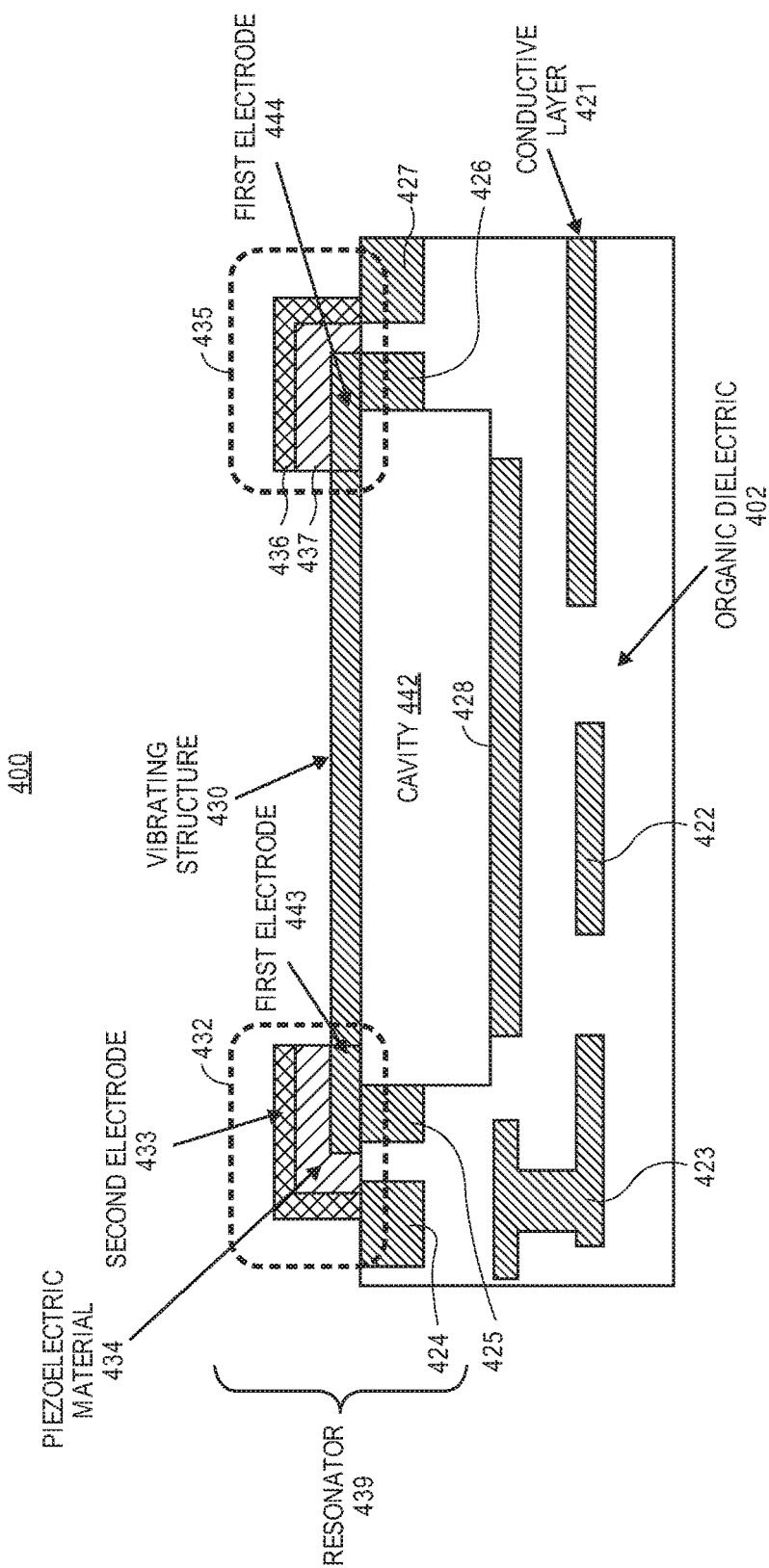
FIG. 4 illustrates a package substrate having a package-integrated piezoelectric resonator device, according to an embodiment.

In one example, the transducers can be implemented by depositing and patterning piezoelectric materials such as PZT, sodium potassium niobate, ZnO, or other materials in the package substrate sandwiched between conductive electrodes as shown in FIG. 4 in accordance with one embodiment. FIG. 4 illustrates a package substrate having a package-integrated piezoelectric resonator device, according to an embodiment. In one example, the package substrate 400 may be coupled or attached to multiple devices (e.g., die, chip, CPU, silicon die or chip, etc.) and also coupled or attached to a printed circuit board (e.g., PCB 110). The package substrate 400 (e.g., organic substrate) includes organic dielectric layers 402 and conductive layers 421-428. The package substrate 400 can be formed during package substrate processing (e.g., panel level). A cavity 442 is formed within the packaging substrate 400 by removing one or more layers (e.g., organic layers, dielectric layers, etc.) from the packaging substrate 400. In one example, a piezoelectric resonator device 439 (e.g., resonator) is formed with conductive vibrating structure 430, first transducer 432, and second transducer 435. The first transducer includes a conductive second electrode 433, a piezoelectric material 434, and a region 443 of the vibrating structure 430 that acts as a first electrode of the first transducer. The second transducer includes a conductive second electrode 436, a piezoelectric material 437, and a region 444 of the vibrating structure 430 (e.g., beam, membrane) that acts as a first electrode of the second transducer. In one example, the piezoelectric material 434 is disposed (e.g., deposited) on the region 443 (first electrode 443) and the conductive second electrode 433 is disposed (e.g., deposited) on the material 434. The piezoelectric material 437 is disposed (e.g., deposited) on the region 444 (first electrode 444) and the conductive second electrode 436 is disposed (e.g., deposited) on the material 437. The cavity 442 can be air filled or vacuum filled. The vibrating structure 430 is anchored on edges of the cavity by package connections 425 and 426 (e.g., anchors, vias) which may serve as both mechanical anchors as well as electrical connections to the rest of the package.

Copper or other conductive material can be used as the electrodes. The vibrating structure itself can be a copper trace as well such as a beam or membrane for example. In one configuration, the vibrating structure 430 itself can act as the first electrode for the piezoelectric elements as shown in FIG. 4, or alternatively, a separate material can be deposited and patterned as the first electrode, after depositing an insulating layer to electrically decouple this first electrode from the conductive vibrating structure as illustrated in FIG. 5.

Figure 5:
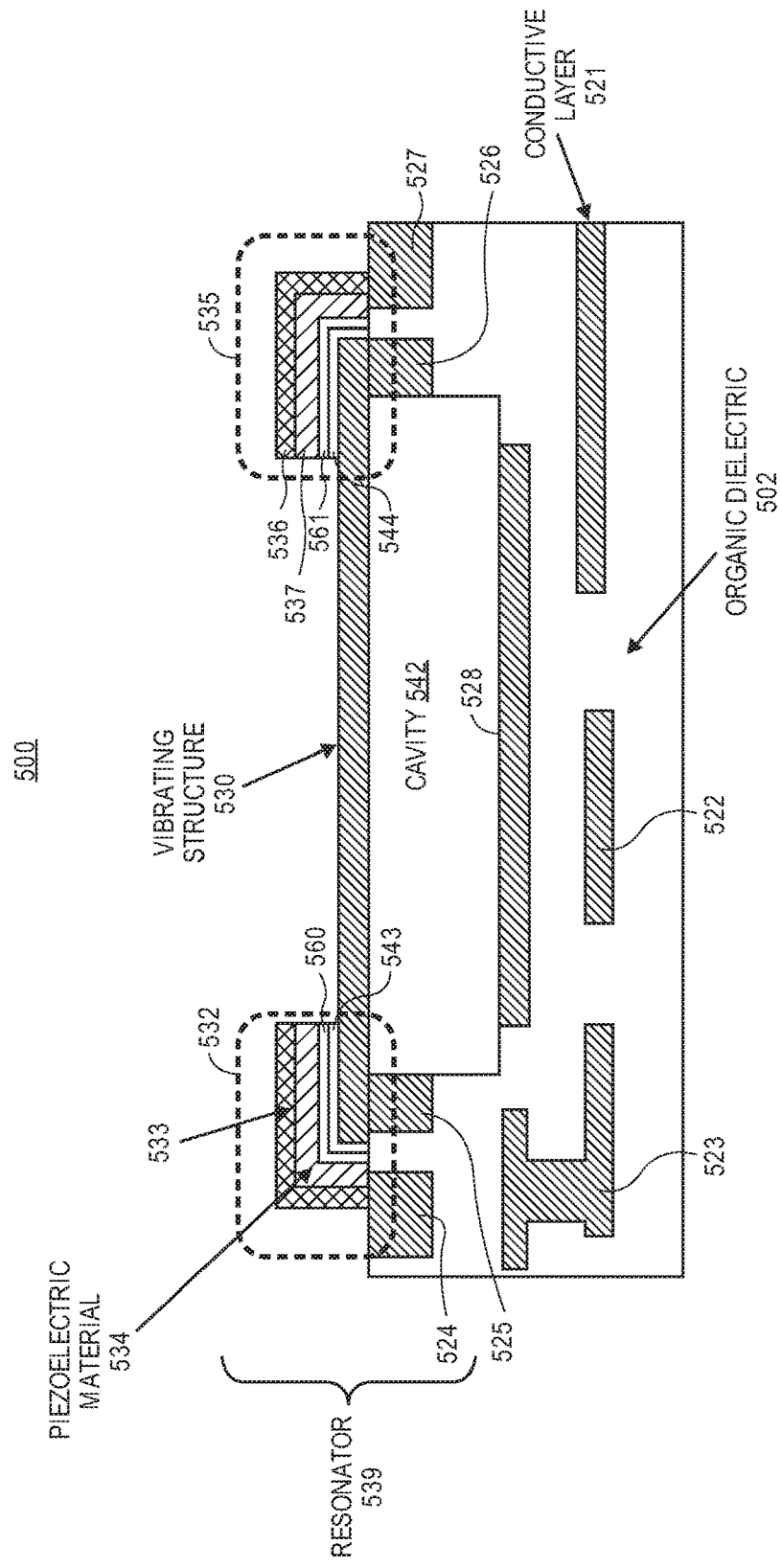
FIG. 5 illustrates a package substrate having a package-integrated piezoelectric resonator device, according to an embodiment.

FIG. 5 illustrates a package substrate having a package-integrated piezoelectric resonator device, according to an embodiment. In one example, the package substrate 500 may be coupled or attached to multiple devices (e.g., die, chip, CPU, silicon die or chip, etc.) and also coupled or attached to a printed circuit board (e.g., PCB 110). The package substrate 500 (e.g., organic substrate) includes organic dielectric layers 502 and conductive layers 521-528. The package substrate 500 can be formed during package substrate processing (e.g., panel level). A cavity 542 is formed within the packaging substrate 500 by removing one or more layers (e.g., organic layers, dielectric layers, etc.) from the packaging substrate 500. In one example, a piezoelectric resonator device 539 (e.g., resonator) is formed with conductive vibrating structure 530, first transducer 532, and second transducer 535. The first transducer includes a conductive second electrode 533, a piezoelectric material 534, a first electrode 560, and an insulating layer 543 that electrically isolates the first electrode 560 from the vibrating structure 530. The second transducer includes a conductive second electrode 536, a piezoelectric material 537, a first electrode 561, and an insulating layer 544 that electrically isolates the first electrode 561 from the vibrating structure 530 (e.g., beam, membrane). In one example, the piezoelectric material 534 is disposed (e.g., deposited) on the first electrode 560 and the conductive second electrode 533 is disposed (e.g., deposited) on the material 534. The piezoelectric material 537 is disposed (e.g., deposited) on the first electrode 561 and the conductive second electrode 536 is disposed (e.g., deposited) on the material 537. The cavity 542 can be air filled or vacuum filled. The vibrating structure 530 is anchored on edges of the cavity by package connections 525 and 526 (e.g., anchors, vias) which may serve as both mechanical anchors as well as electrical connections to the rest of the package.

Organic dielectric normally surrounds copper traces in packages/PCBs; however this organic material is removed around the transducers 532 and 535 and vibrating structure 530 in FIG. 5 to allow mechanical vibrations with high amplitude at resonance. Conductive layer 528 may act as an etch stop during the formation of the cavity 542.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 6:
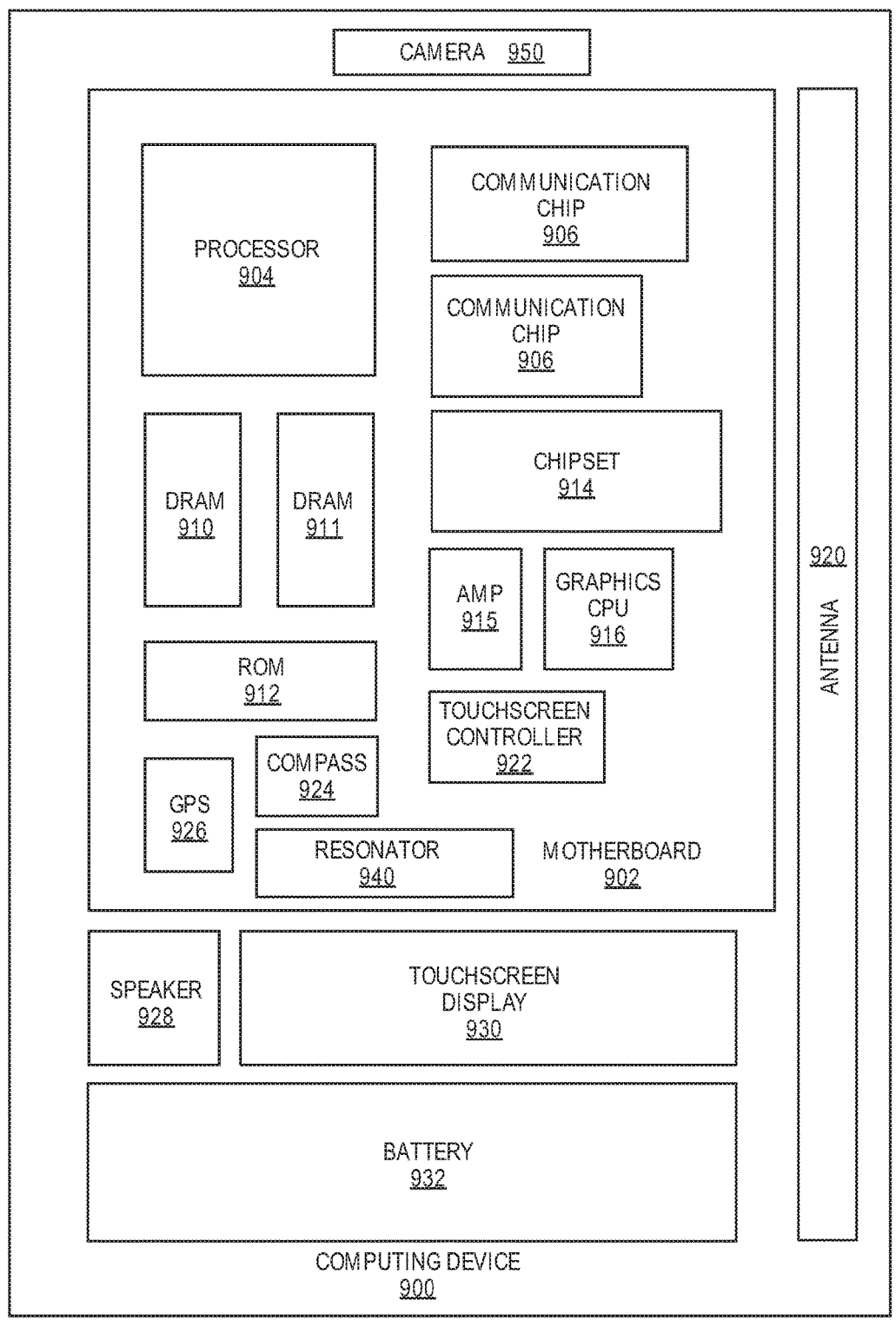
FIG. 6 illustrates a computing device 900 in accordance with one embodiment.

FIG. 6 illustrates a computing device 900 in accordance with one embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna 920, a display, a touchscreen display 930, a touchscreen controller 922, a battery 932, an audio codec, a video codec, a power amplifier 915, a global positioning system (GPS) device 926, a compass 924, a resonator 940 (e.g., a piezoelectric vibrating device), a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig and Bluetooth and a second communication chip 906 may be dedicated to longer range wireless communications such as GPS, EDGE, GPRS, CDMA, WiMAX, LTE, Ev-DO, 5G, and others.

The processor 904 of the computing device 900 includes an integrated circuit die packaged within the processor 904. In some implementations of the invention, the processor package includes one or more devices, such as resonator devices in accordance with implementations of embodiments of the invention. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

The following examples pertain to further embodiments.

Example 1 is a resonator comprising an input transducer that includes a first piezoelectric material, a vibrating structure coupled to the input transducer, and an output transducer coupled to the vibrating structure. The vibrating structure is positioned above a cavity within an organic substrate. The output transducer includes a second piezoelectric material. In operation, the input transducer causes an input electrical signal to be converted into mechanical vibrations which propagate across the vibrating structure to the output transducer.

In example 2, the subject matter of example 1 can optionally include in operation the output transducer causing the mechanical vibrations to be converted into an output electrical signal.

In example 3, the subject matter of any of examples 1-2 can optionally further include the input transducer further comprises a first region of the vibrating structure that acts as a first electrode of the input transducer and a second electrode of the input transducer is disposed on the first piezoelectric material.

In example 4, the subject matter of any of examples 1-3 can optionally further include the output transducer further comprises a second region of the vibrating structure that acts as a first electrode of the output transducer and a second electrode of the output transducer is disposed on the second piezoelectric material.

In example 5, the subject matter of any of examples 1-4 can optionally further include the vibrating structure comprises a suspended mechanical beam that is suspended over the cavity.

In example 6, the subject matter of any of examples 1-5 can optionally further include the resonator being integrated with the organic substrate which is fabricated with panel level processing.

In example 7, the subject matter of any of examples 1-6 can optionally further include the resonator being integrated with the organic substrate to reduce routing parasitics.

In example 8, the subject matter of any of examples 1-7 can optionally further include the input electrode being biased with the input electrical signal having a frequency approximately equal to a mechanical resonant frequency of the vibrating structure in order to operate at resonance.

Example 9 is a package substrate comprising a plurality of organic dielectric layers and a plurality of conductive layers to form the package substrate, a cavity formed in the package substrate, and a piezoelectric device integrated within the package substrate. The piezoelectric device includes an input transducer, a vibrating structure coupled to the input transducer, and an output transducer coupled to the vibrating structure. In operation a first piezoelectric material of the input transducer causes an input electrical signal to be converted into mechanical vibrations which propagate across the vibrating structure to the output transducer.

In example 10, the subject matter of example 9 can optionally further include in operation the output transducer causing the mechanical vibrations to be converted into an output electrical signal.

In example 11, the subject matter of any of examples 9-10 can optionally further include the input transducer further comprises a first region of the vibrating structure that acts as a first electrode of the input transducer and a second electrode of the input transducer is disposed on the first piezoelectric material.

In example 12, the subject matter of any of examples 9-11 can optionally further include the output transducer further comprising a second region of the vibrating structure that acts as a first electrode of the output transducer and a second electrode of the output transducer is disposed on a second piezoelectric material of the output transducer.

In example 13, the subject matter of any of examples 9-12 can optionally further include the vibrating structure comprises a suspended mechanical beam that is suspended over the cavity.

In example 14, the subject matter of any of examples 9-13 can optionally further include in operation the input electrode being biased with an input electrical signal having a frequency approximately equal to a mechanical resonant frequency of the vibrating structure in order to operate at resonance.

Example 15 is a resonator comprising an input transducer that includes first and second electrodes and a first piezoelectric material, a vibrating structure coupled to the input transducer, and an output transducer coupled to the vibrating structure. The vibrating structure is positioned above a cavity within an organic substrate. The output transducer includes first and second electrodes and a second piezoelectric material. In operation the input transducer causes an input electrical signal to be converted into mechanical vibrations which propagate across the vibrating structure to the output transducer.

In example 16, the subject matter of example 15 can optionally further include in operation the output transducer causing the mechanical vibrations to be converted into an output electrical signal.

In example 17, the subject matter of any of examples 15-17 can optionally further include a first insulating layer to electrically isolate the first electrode of the input transducer from the vibrating structure and a second insulating layer to electrically isolate the first electrode of the output transducer from the vibrating structure. The resonator is integrated with the organic substrate which includes organic layers.

Example 18 is a computing device comprising at least one processor to process data and a package substrate coupled to the at least one processor. The package substrate includes a plurality of organic dielectric layers and a plurality of conductive layers to form the package substrate which includes a piezoelectric resonator which comprises an input transducer having a first piezoelectric material, a vibrating structure coupled to the input transducer, and an output transducer coupled to the vibrating structure. The output transducer includes a second piezoelectric material. In operation the input transducer causes an input electrical signal to be converted into mechanical vibrations which propagate across the vibrating structure to the output transducer. In example 19, the subject matter of example 18 can optionally further include the resonator being integrated with the organic package substrate having organic layers. In example 20, the subject matter of any of examples 18-19 can optionally further include a printed circuit board coupled to the package substrate.

The invention claimed is:

1. A resonator, comprising:
an input transducer that includes a first piezoelectric material;
a vibrating structure coupled to the input transducer, the vibrating structure positioned above a cavity within an organic substrate; and
an output transducer coupled to the vibrating structure, the output transducer includes a second piezoelectric material, wherein in operation the input transducer causes an input electrical signal to be converted into mechanical vibrations which propagate across the vibrating structure to the output transducer.

2. The resonator of claim 1, wherein in operation the output transducer causes the mechanical vibrations to be converted into an output electrical signal.

3. The resonator of claim 1, wherein the input transducer further comprises a first region of the vibrating structure that acts as a first electrode of the input transducer and a second electrode of the input transducer is disposed on the first piezoelectric material.

4. The resonator of claim 3, wherein the output transducer further comprises a second region of the vibrating structure that acts as a first electrode of the output transducer and a second electrode of the output transducer is disposed on the second piezoelectric material.

5. The resonator of claim 1, wherein the vibrating structure comprises a suspended mechanical beam that is suspended over the cavity.

6. The resonator of claim 1, wherein the resonator is integrated with the organic substrate which is fabricated with panel level processing.

7. The resonator of claim 6, wherein the resonator is integrated with the organic substrate to reduce routing parasitics.

8. The resonator of claim 1, wherein the input electrode is biased with the input electrical signal having a frequency approximately equal to a mechanical resonant frequency of the vibrating structure in order to operate at resonance.

9. A package substrate comprising:
a plurality of organic dielectric layers and a plurality of conductive layers to form the package substrate;
a cavity formed in the package substrate; and
a piezoelectric device integrated within the package substrate, the piezoelectric device includes an input transducer, a vibrating structure coupled to the input transducer, and an output transducer coupled to the vibrating structure, wherein in operation a first piezoelectric material of the input transducer causes an input electrical signal to be converted into mechanical vibrations which propagate across the vibrating structure to the output transducer.

10. The package substrate of claim 9, wherein in operation the output transducer causes the mechanical vibrations to be converted into an output electrical signal.

11. The package substrate of claim 9, wherein the input transducer further comprises a first region of the vibrating structure that acts as a first electrode of the input transducer and a second electrode of the input transducer is disposed on the first piezoelectric material.

12. The package substrate of claim 9, wherein the output transducer further comprises a second region of the vibrating structure that acts as a first electrode of the output transducer and a second electrode of the output transducer is disposed on a second piezoelectric material of the output transducer.

13. The package substrate of claim 9, wherein the vibrating structure comprises a suspended mechanical beam that is suspended over the cavity.

14. The package substrate of claim 9, wherein in operation the input electrode is biased with an input electrical signal having a frequency approximately equal to a mechanical resonant frequency of the vibrating structure in order to operate at resonance.

15. A resonator comprising:
- an input transducer that includes first and second electrodes and a first piezoelectric material;
- a vibrating structure coupled to the input transducer, the vibrating structure positioned above a cavity within an organic substrate; and
- an output transducer coupled to the vibrating structure, the output transducer includes first and second electrodes and a second piezoelectric material, wherein in operation the input transducer causes an input electrical signal to be converted into mechanical vibrations which propagate across the vibrating structure to the output transducer.

16. The resonator of claim 15, wherein in operation the output transducer causes the mechanical vibrations to be converted into an output electrical signal.

17. The resonator of claim 15, further comprising:
- a first insulating layer to electrically isolate the first electrode of the input transducer from the vibrating structure; and
- a second insulating layer to electrically isolate the first electrode of the output transducer from the vibrating structure, wherein the resonator is integrated with the organic substrate which includes organic layers.

18. A computing device comprising:
- at least one processor to process data; and
- a package substrate coupled to the at least one processor, the package substrate includes a plurality of organic dielectric layers and a plurality of conductive layers to form the package substrate which includes a piezoelectric resonator which comprises, an input transducer having a first piezoelectric material, a vibrating structure coupled to the input transducer, and an output transducer coupled to the vibrating structure, the output transducer includes a second piezoelectric material, wherein in operation the input transducer causes an input electrical signal to be converted into mechanical vibrations which propagate across the vibrating structure to the output transducer.

19. The computing device of claim 18, wherein the resonator is integrated with the organic package substrate having organic layers.

20. The computing device of claim 18, further comprising:
- a printed circuit board coupled to the package substrate.

* * * * *